(12) United States Patent
Lai et al.

(10) Patent No.: US 11,663,455 B2
(45) Date of Patent: May 30, 2023

(54) RESISTIVE RANDOM-ACCESS MEMORY CELL AND ASSOCIATED CELL ARRAY STRUCTURE

(71) Applicant: eMemory Technology Inc., Hsin-Chu (TW)

(72) Inventors: Tsung-Mu Lai, Hsinchu County (TW); Wei-Chen Chang, Hsinchu County (TW); Hsueh-Wei Chen, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 346 days.

(21) Appl. No.: 17/102,555

(22) Filed: Nov. 24, 2020

(65) Prior Publication Data

US 2021/0249601 A1    Aug. 12, 2021

Related U.S. Application Data

(60) Provisional application No. 62/975,671, filed on Feb. 12, 2020.

(51) Int. Cl.
| | |
|---|---|
| *H01L 45/00* | (2006.01) |
| *G06N 3/063* | (2023.01) |
| *G06N 3/04* | (2023.01) |
| *H01L 23/522* | (2006.01) |

(52) U.S. Cl.
CPC ............... *G06N 3/063* (2013.01); *G06N 3/04* (2013.01); *H01L 23/5226* (2013.01); *H10B 20/20* (2023.02); *H10B 63/30* (2023.02); *H10N 70/041* (2023.02); *H10N 70/8833* (2023.02)

(58) Field of Classification Search
CPC ............... H01L 45/1233; H01L 45/146; H01L 27/2436; H01L 27/2463
See application file for complete search history.

(56) References Cited

U.S. PATENT DOCUMENTS

| | | | |
|---|---|---|---|
| 8,803,124 | B2 | 8/2014 | Pramanik et al. |
| 9,281,074 | B2 | 3/2016 | Wu et al. |
| 9,634,015 | B2 | 4/2017 | Wong et al. |
| 2021/0249601 | A1* | 8/2021 | Lai ...................... H01L 27/2436 |

FOREIGN PATENT DOCUMENTS

WO   WO2016048681 A1   3/2016

OTHER PUBLICATIONS

Chin Yu Mei et al., "28-nm 2T High-K Metal Gate Embedded RRAM With Fully Compatible CMOS Logic Processes", Oct. 2013, pp. 1253-1255, vol. 34, No. 10, IEEE Electron Device Letters.

* cited by examiner

Primary Examiner — Mark V Prenty
(74) Attorney, Agent, or Firm — WPAT, P.C.

(57) ABSTRACT

A resistive random-access memory cell includes a well region, a first doped region, a second doped region, a third doped region, a first gate structure, a second gate structure and a third gate structure. The first gate structure is formed over the surface of the well region between the first doped region and the second doped region. The second gate structure is formed over the second doped region. The third gate structure is formed over the surface of the well region between the second doped region and the third doped region. A first metal layer is connected with the first doped region and the third doped region. A second metal layer is connected with the conductive layer of the first gate structure and the conductive layer of the third gate structure.

19 Claims, 8 Drawing Sheets

1

RESISTIVE RANDOM-ACCESS MEMORY CELL AND ASSOCIATED CELL ARRAY STRUCTURE

This application claims the benefit of U.S. provisional application Ser. No. 62/975,671, filed Feb. 12, 2020, the subject matter of which is incorporated herein by reference.

FIELD OF THE INVENTION

The present invention relates to a memory cell of a non-volatile memory, and more particularly to a resistive random-access memory cell and an associated cell array structure.

BACKGROUND OF THE INVENTION

A resistive random-access memory (ReRAM) is one kind of non-volatile memory. The resistive random-access memory comprises plural resistive random-access memory cells (ReRAM cells). Since the resistive random-access memories have higher scaling potential and higher writing speed, memory manufacturers and foundries pay much attention to the development of the resistive random-access memories.

FIG. 1 schematically illustrates the structure of a conventional resistive random-access memory cell. As shown in FIG. 1, the resistive random-access memory cell 100 comprises a bottom electrode 106, an insulation layer 104 and a top electrode 102, which are arranged in a stack form. After the resistive random-access memory cell 100 is fabricated, the resistive random-access memory cell 100 is in an initial state.

Before the resistive random-access memory cell 100 is enabled, a forming action is performed to apply a forming voltage to the top electrode 102 and the bottom electrode 106. While the forming action is performed, the cluster of oxygen vacancies in the insulation layer 104 forms a conducting filament 108. In addition, the conducting filament 108 is connected with the top electrode 102 and the bottom electrode 106.

After the forming action is completed, the resistive random-access memory cell 100 can switch its resistance repeatedly with operation voltages lower than the forming voltage.

Moreover, when the resistive random-access memory cell 100 is in the set state corresponding to the low resistance value, a reset action may be performed to switch the set state to a reset state (i.e., a high resistance value). While the reset action is performed, a reset voltage is applied to the top electrode 102 and the bottom electrode 106. Meanwhile, the conducting filament 108 within the insulation layer 104 is treated by a redox process. Consequently, the conducting filament 108 is barely connected between the top electrode 102 and the bottom electrode 106. After the reset action is completed, the region between the top electrode 102 and the bottom electrode 106 has the high resistance value (i.e., in the reset state).

When the resistive random-access memory cell 100 is in the reset state corresponding to the high resistance value, the resistive random-access memory 100 can be switched to the set state through a set action. While the set action is performed, a set voltage is applied to the top electrode 102 and the bottom electrode 106. Consequently, the conducting filament 108 within the insulation layer 104 can be well connected between the top electrode 102 and the bottom electrode 106 again. After the set action is completed, the region between the top electrode 102 and the bottom electrode 106 has the low resistance value (i.e., in the set state).

Consequently, in response to a program action during a program cycle, the resistive random-access memory cell 100 can be selectively in the set state through the set action or in the reset state through the rest action. In other words, the set state and the reset state are two storage states of the resistive random-access memory cell 100.

Moreover, in response to a read action during a read cycle, a read voltage is applied to the top electrode 102 and the bottom electrode 106. According to the magnitude of a read current generated by the resistive random-access memory cell 100, the storage state (i.e., the set state or the reset state) of the resistive random-access memory cell 100 can be realized.

SUMMARY OF THE INVENTION

The present invention provides a resistive random-access memory cell and an associated cell array structure. The resistive random-access memory cell has a three-transistor configuration (i.e., a 3T cell configuration) or a five-transistor configuration (i.e., a 5T cell configuration). The cell array structure comprises plural resistive random-access memory cells.

An embodiment of the present invention provides a cell array structure. The cell array structure includes a first resistive random-access memory cell. The first resistive random-access memory cell includes a well region, a first doped region, a second doped region, a third doped region, a first gate structure, a second gate structure, a third gate structure, a first metal layer and a second metal layer. The first doped region, the second doped region and the third doped region are formed under a surface of the well region. The first gate structure is formed over the surface of the well region between the first doped region and the second doped region. The first gate structure includes a stack structure with a first insulation layer and a first conductive layer. The second gate structure is formed over the second doped region. The second gate structure includes a stack structure with a second insulation layer and a second conductive layer. The second conductive layer is served as a first source line. The third gate structure is formed over the surface of the well region between the second doped region and the third doped region. The third gate structure includes a stack structure with a third insulation layer and a third conductive layer. The first metal layer is connected with the first doped region and the third doped region. The first metal layer is served as a first bit line. The second metal layer is connected with the first conductive layer and the third conductive layer. The second metal layer is served as a first word line. During a forming action, the first source line receives a forming voltage, the first word line receives an on voltage, the first bit line receives a ground voltage, and a conducting filament is formed in the second insulation layer. Consequently, the first resistive random-access memory cell is in a set state corresponding to a low resistance value.

Another embodiment of the present invention provides a cell array structure. The cell array structure includes a first resistive random-access memory cell. The first resistive random-access memory cell includes a well region, a first doped region, a second doped region, a third doped region, a fourth doped region, a fifth doped region, a first gate structure, a second gate structure, a third gate structure, a fourth gate structure, a fifth gate structure, a first metal layer, a second metal layer and a third metal layer. The first doped region, the second doped region, the third doped region, the fourth doped region and the fifth doped region are formed under a surface of the well region. The first gate structure is formed over the surface of the well region between the first doped region and the second doped region. The first gate structure includes a stack structure with a first insulation layer and a first conductive layer. The second gate structure is formed over the surface of the well region between the second doped region and the third doped region. The second gate structure includes a stack structure with a second insulation layer and a second conductive layer. The third gate structure is formed over the third doped region. The third gate structure includes a stack structure with a third insulation layer and a third conductive layer. The fourth gate structure is formed over the surface of the well region between the third doped region and the fourth doped region. The fourth gate structure includes a stack structure with a fourth insulation layer and a fourth conductive layer. The fifth gate structure is formed over the surface of the well region between the fourth doped region and the fifth doped region. The fifth gate structure includes a stack structure with a fifth insulation layer and a fifth conductive layer. The first metal layer is connected with the first doped region and the fifth doped region. The first metal layer is served as a first bit line. The second metal layer is connected with the first conductive layer and the fifth conductive layer. The second metal layer is served as a first word line. The third metal layer is connected with the second conductive layer and the fourth conductive layer. The third metal layer is served as a second word line. During a forming action, the first source line receives a forming voltage, the first word line receives a first on voltage, the second word line receives a second on voltage, the first bit line receives a ground voltage, and a conducting filament is formed in the third insulation layer. Consequently, the first resistive random-access memory cell is in a set state corresponding to a low resistance value.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
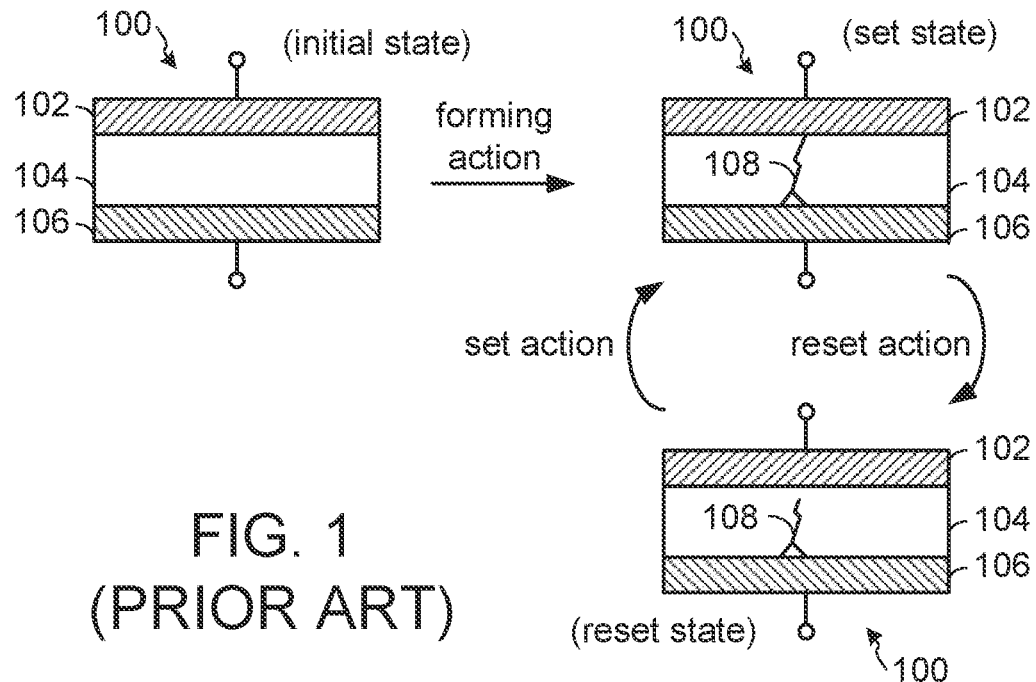
FIG. 1 (prior art) schematically illustrates the structure of a conventional resistive random-access memory cell.
Figure 2A:
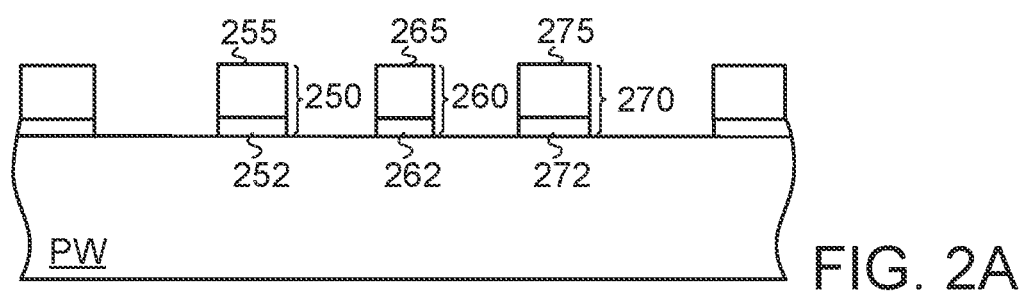
FIGS. 2A, 2B and 2C are schematic cross-sectional views illustrating a process of manufacturing a resistive random-access memory cell according to a first embodiment of the present invention.
Figure 2B:
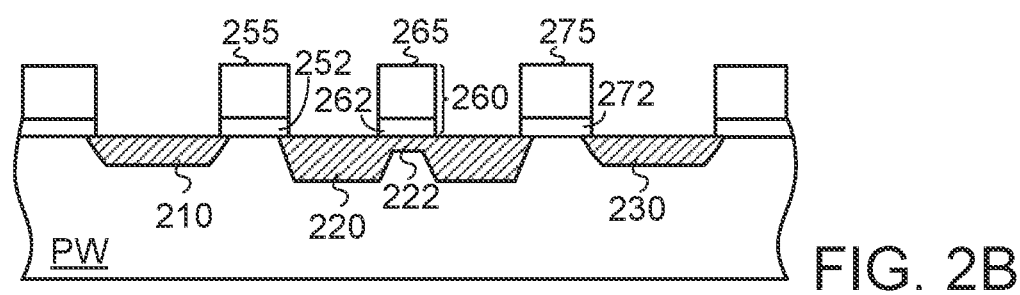
Figure 2C:
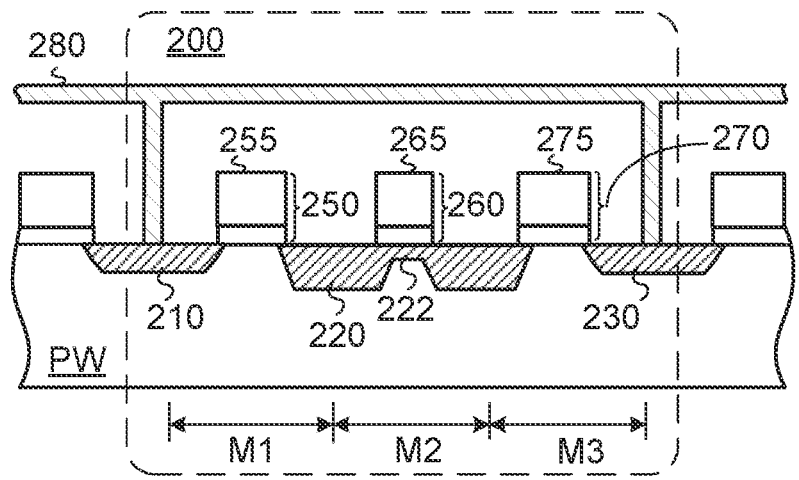
Figure 2D:
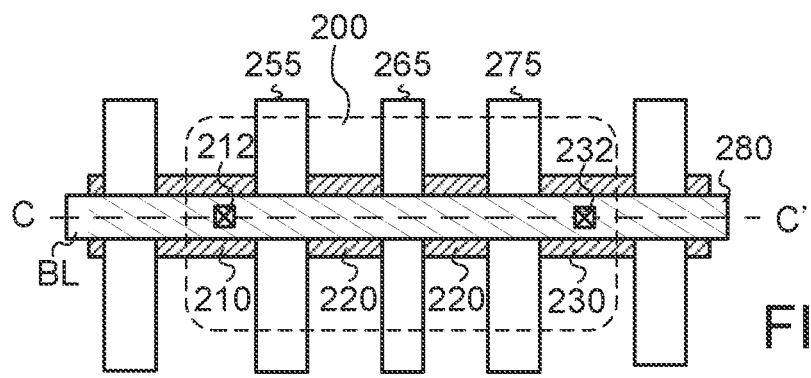
FIG. 2D is a schematic top view illustrating the resistive random-access memory cell according to the first embodiment of the present invention.
Figure 2E:
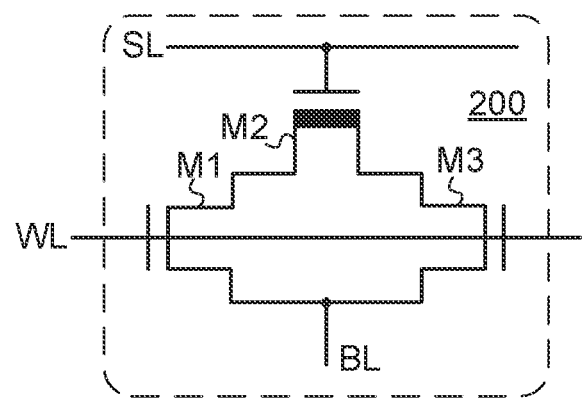
FIG. 2E is a schematic equivalent circuit diagram of the resistive random-access memory cell according to the first embodiment of the present invention.

FIGS. 2A, 2B and 2C are schematic cross-sectional views illustrating a process of manufacturing a resistive random-access memory cell according to a first embodiment of the present invention. FIG. 2D is a schematic top view illustrating the resistive random-access memory cell according to the first embodiment of the present invention. FIG. 2E is a schematic equivalent circuit diagram of the resistive random-access memory cell according to the first embodiment of the present invention.

As shown in FIG. 2A, plural gate structures 250, 260, and 270 are formed over the surface of a P-well region PW. The gate structures 250, 260, and 270 have the same structure. The gate structure 250 comprises an insulation layer 252 and a conductive layer 255. The gate structure 260 comprises an insulation layer 262 and a conductive layer 265. The gate structure 270 comprises an insulation layer 272 and a conductive layer 275. Take the second gate structure 260 for example. The insulation layer 262 is located over the surface of the P-well region PW, and the conductive layer 265 is located above the insulation layer 262.

Please refer to FIG. 2A. In this embodiment, each of the insulation layer 262 and the conductive layer 265 is a stack structure with plural material layers. For example, the insulation layer 262 is a stack structure with a silicon dioxide layer ($SiO_2$) and a hafnium dioxide layer ($HfO_2$), and the conductive layer 265 is a stack structure with a titanium layer (Ti), a titanium nitride layer (TiN) and a tungsten layer (W). The hafnium dioxide layer ($HfO_2$) is a high dielectric constant (high-k) material layer, which is suitable for the resistive random-access memory. The silicon dioxide layer (SiO$_2$) is located over the surface of the P-well region PW. The hafnium dioxide layer (HfO$_2$) is located over the silicon dioxide layer (SiO$_2$). The titanium layer (Ti) is located over the hafnium dioxide layer (HfO$_2$). The titanium layer (TiN) is located over the titanium layer (Ti). The tungsten layer (W) is located over the titanium nitride layer (TiN).

It is noted that the examples of the material layers of the gate structure are not restricted. That is, the material layers may be modified. For example, in another embodiment, the high high-k material layer in the insulation layer 262 is replaced by a tantalum oxide layer (TaOx) or a hafnium oxide layer (HfOx). Alternatively, the conductive layer 265 is a stack structure with a titanium layer (Ti) and a tungsten layer (W).

Please refer to FIG. 2B. After an implantation process is performed, a first doped region 210, a second doped region 220 and a third doped region 230 are formed under the exposed surface of the P-type well region PW. The second doped region 220 is a merged doped region.

In a semiconductor CMOS process, a lightly doped drain (LDD) region can be formed in the doped region. In FIG. 2B, five gate structures are shown. During the implantation process, four separate doped regions are formed. Moreover, an extended lightly doped drain (LDD) region 222 is formed in the two doped regions on both sides of the second gate structure 260. Consequently, the two doped regions on both sides of the second gate structure 260 are overlapped to form the merged doped region 220. It is to be noted that in another embodiment, the extended lightly doped drain (LDD) region can be omitted.

Please refer to FIGS. 2C and 2D. A first metal layer 280 is formed over the three gate structures 250, 260 and 270, and connected with the first doped region 210 and the third doped region 230 through two vias 212 and 232. A second metal layer (not shown) is connected with the conductive layers 255 and 275. Consequently, the resistive random-access memory cell 200 is fabricated. Moreover, FIG. 2C is the cross-sectional view of the resistive random-access memory cell 200 as shown in FIG. 2D and taken along the line CC'.

In this embodiment, the first metal layer 280 is served as a bit line BL of the resistive random-access memory cell 200, the second metal layer (not shown) is served as a word line WL of the resistive random-access memory cell 200, and the conductive layer 265 is served as a source line SL of the resistive random-access memory cell 200.

Please refer to FIG. 2C again. The first doped region 210, the second doped region 220 and the first gate structure 250 are collaboratively formed as a first transistor M1. The second doped region 220 and the second gate structure 260 are collaboratively formed as a second transistor M2. The second doped region 220, the third doped region 230 and the third gate structure 270 are collaboratively formed as a third transistor M3. As mentioned above, the second doped region 220 is the merged doped region. Consequently, it is considered that the two drain/source terminals of the second transistor M2 are connected with each other.

As shown in FIG. 2E, the resistive random-access memory cell 200 comprises three transistors M1, M2 and M3. The first drain/source terminal of the first transistor M1 is connected with the bit line BL. The gate terminal of the first transistor M1 is connected with the word line WL. The first drain/source terminal and the second drain/source terminal of the second transistor M2 are connected with each other. Moreover, the first drain/source terminal of the second transistor M2 is connected with the second drain/source terminal of the first transistor M1. The gate terminal of the second transistor M2 is connected with the source line SL. The first drain/source terminal of the third transistor M3 is connected with the bit line BL. The second drain/source terminal of the third transistor M3 is connected with the second drain/source terminal of the second transistor M2. The gate terminal of the third transistor M3 is connected with the word line WL. In other words, the resistive random-access memory cell 200 of this embodiment has a three-transistor configuration, which is also referred as a 3T cell configuration.

Figure 3A:
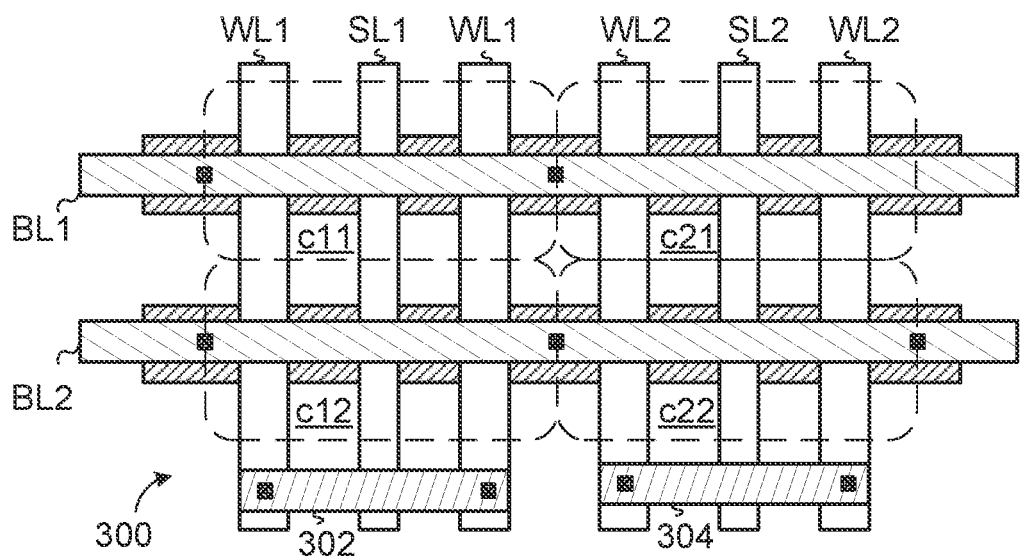
FIG. 3A is a schematic top view illustrating a cell array structure with plural random-access memory cells.
Figure 3B:
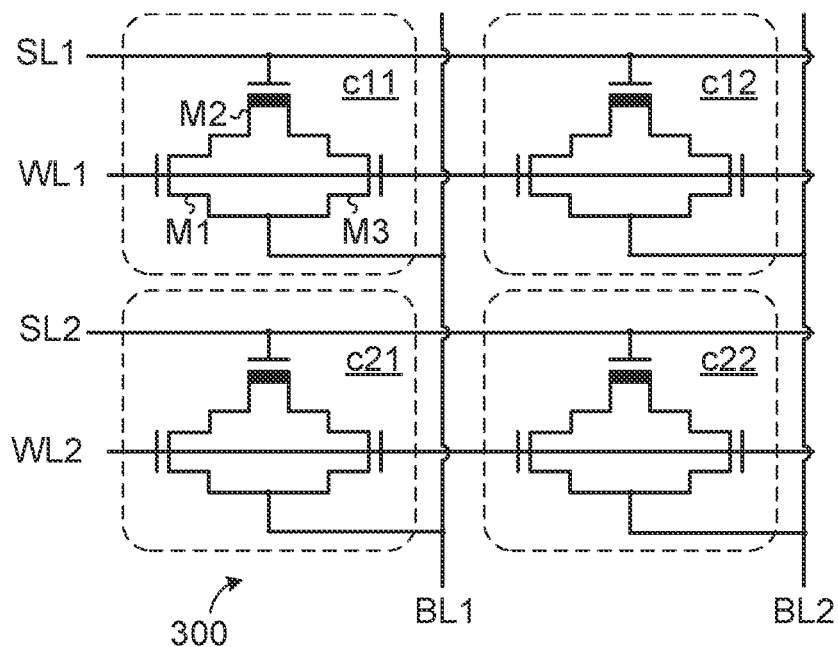
FIG. 3B is a schematic equivalent circuit diagram illustrating the cell array structure as shown in FIG. 3A.

Moreover, plural random-access memory cells can be combined as a cell array structure. FIG. 3A is a schematic top view illustrating a cell array structure with plural random-access memory cells. FIG. 3B is a schematic equivalent circuit diagram illustrating the cell array structure as shown in FIG. 3A. The cell array structure comprises m×n random-access memory cells, wherein m and n are positive integers. For illustration, the cell array structure 300 of this embodiment comprises 2×2 random-access memory cells c11~c22. Each of the resistive random-access memory cells c11~c22 has the structure as shown in FIGS. 2D and 2E.

As shown in FIG. 3A, a metal layer 302 is connected with the gate terminals of the first transistor and the third transistor in the resistive random-access memory cell c11. The metal layer 302 can be used as the first word line WL1. Similarly, a metal layer 304 is connected with the gate terminals of the first transistor and the third transistor in the resistive random-access memory cell c21. The metal layer 304 can be used as a word line WL2.

Please refer to the cell array structure 300 of FIG. 3B. Both of the two random-access memory cells c11~c12 in the first row are connected with the first word line WL1 and the first source line SL1. Moreover, the resistive random-access memory cells c11~c12 are connected with the first bit line BL1 and the second bit line BL2, respectively. Both of the two random-access memory cells c21~c22 in the second row are connected with the second word line WL2 and the second source line SL2. Moreover, the resistive random-access memory cells c21~c22 are connected with the first bit line BL1 and the second bit line BL2, respectively.

By providing proper bias voltages to the word lines WL1~WL2, the source lines SL1~SL2 and the bit lines BL1~BL2 of the cell array structure 300, a forming action, a reset action, a set action or a read action can be selectively performed.

The bias voltages for performing different actions on the cell array structure 300 are shown in FIGS. 4A-4D. Whenever the cell array structure 300 is enabled, one word line is activated. The row of the cell array structure 300 corresponding to the activated word line is referred as a selected row. The rows of the cell array structure 300 corresponding to the other word lines are unselected rows.

Figure 4A:
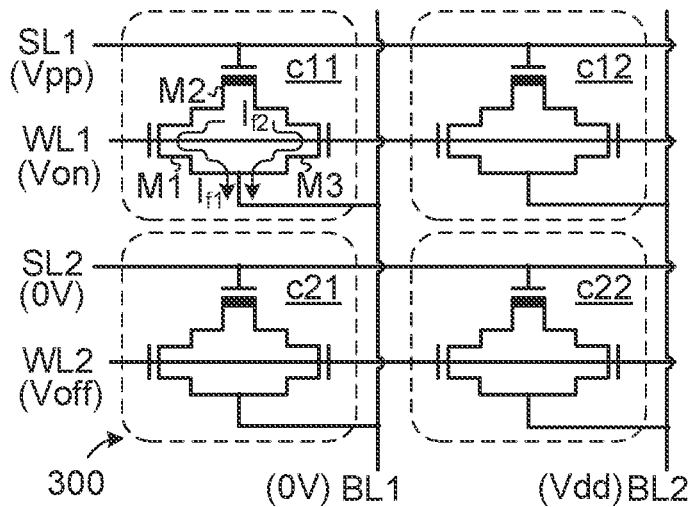
FIG. 4A schematically illustrates the bias voltages for performing a forming action on the cell array structure as shown in FIG. 3B.

After the cell array structure 300 is manufactured, the resistive random-access memory cells c21 to c22 are all in an initial state. Consequently, it is necessary to perform a forming action. The bias voltages for performing a forming action on the cell array structure 300 is shown in FIG. 4A.

During the forming operation, the first word line WL1 receives an on voltage (Von), the second word line WL2 receives an off voltage (Voff), the first source line SL1 receives a forming voltage (Vpp), the second source line SL2 receives a ground voltage (0V), the first bit line BL1 receives the ground voltage (0V), and the second bit line BL2 receives a control voltage (Vdd). Consequently, in the cell array structure 300, the first row connected to the first word line WL1 is a selected row, and the second row connected to the second word line WL2 is an unselected row.

The forming voltage (Vpp), the on voltage (Von) and the control voltage (Vdd) are all positive voltages. The forming voltage (Vpp) is higher than the on voltage (Von), and the forming voltage (Vpp) is higher than the control voltage (Vdd). For example, the forming voltage (Vpp) is 4V, the on voltage (Von) is 0.8V, the control voltage (Vdd) is 0.8V, and the off voltage (Voff) is equal to the ground voltage (0V).

In the selected row, the first source line SL1 receives the forming voltage (Vpp), and the first bit line BL1 receives the ground voltage (0V). Consequently, the resistive random-access memory cell c11 is a selected memory cell. Since the second bit line BL2 receives the control voltage (Vdd), the resistive random-access memory cell c12 is an unselected memory cell. In the unselected row, the second word line WL2 receives the off voltage (Voff). Consequently, the resistive random-access memory cells c21 and c22 are unselected memory cells.

In the selected memory cell c11, the first transistor M1 and the third transistor M3 are turned on. Consequently, the insulation layer in the gate structure of the second transistor M2 is subjected to the forming voltage, and a forming current is generated between the first source line SL1 and the first bit line BL1. The first portion $I_{f1}$ of the forming current flows to the first bit line BL1 through the first transistor M1, and the second portion Ire of the forming current flows to the first bit line BL1 through the third transistor M3. Due to the forming current, a conducting filament is formed in the insulation layer 104. The method of performing the forming action on each of the other resistive random-access memory cells c12~c22 is similar to the method of performing the forming action on the resistive random-access memory cell c11 through the provision of proper bias voltages.

Generally, if the forming current is too large during the forming action, the insulation layer in the selected memory cell c11 is possibly burn-out such that its resistance is no more switchable. For solving these drawbacks, a current limiter is connected with either the first source line SL1 or the first bit line BL1 of the selected memory cell c11 to limit the magnitude of the forming current and prevent from the rupture of the insulation layer in the selected memory cell c11.

Figure 4B:
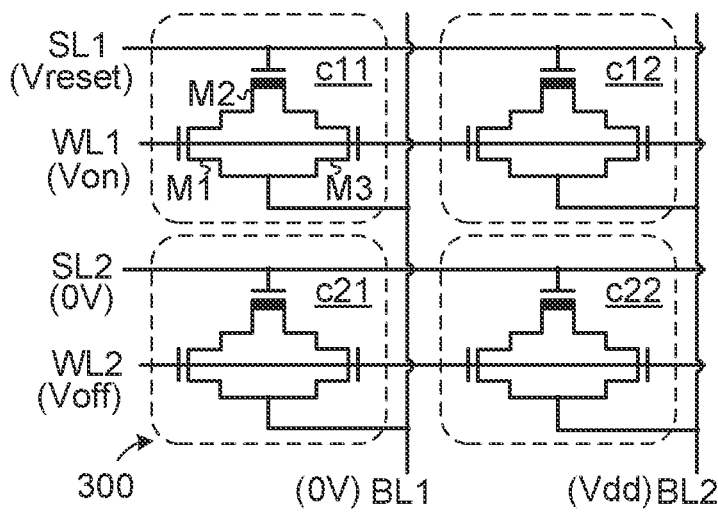
FIG. 4B schematically illustrates the bias voltages for performing a reset action on the cell array structure as shown in FIG. 3B.

FIG. 4B schematically illustrates the bias voltages for performing a reset action on the cell array structure as shown in FIG. 3B. During the reset action, the first word line WL1 receives the on voltage (Von), the second word line WL2 receives the off voltage (Voff), the first source line SL1 receives a reset voltage (Vreset), the second source line SL2 receives the ground voltage (0V), the first bit line BL1 receives the ground voltage (0V), and the second bit line BL2 receives the control voltage (Vdd). Consequently, the resistive random-access memory cell c11 is a selected memory cell, and the resistive random-access memory cells c12 and c22 are unselected memory cells. For example, the reset voltage (Vreset) is 1.65V, the on voltage (Von) is 0.8V, the control voltage (Vdd) is 0.8V, and the off voltage (Voff) is the ground voltage (0V).

In the selected memory cell c11, the first transistor M1 and the third transistor M3 are turned on. Consequently, the insulation layer in the gate structure of the second transistor M2 is subjected to the reset voltage. Under this circumstance, the second transistor M2 is in a reset state corresponding to a high resistance value. That is, the selected memory cell is in the reset state corresponding to the high resistance value. The method of performing the reset action on each of the other resistive random-access memory cells c12~c22 is similar to the method of performing the reset action on the resistive random-access memory cell c11 through the provision of proper bias voltages.

Figure 4C:
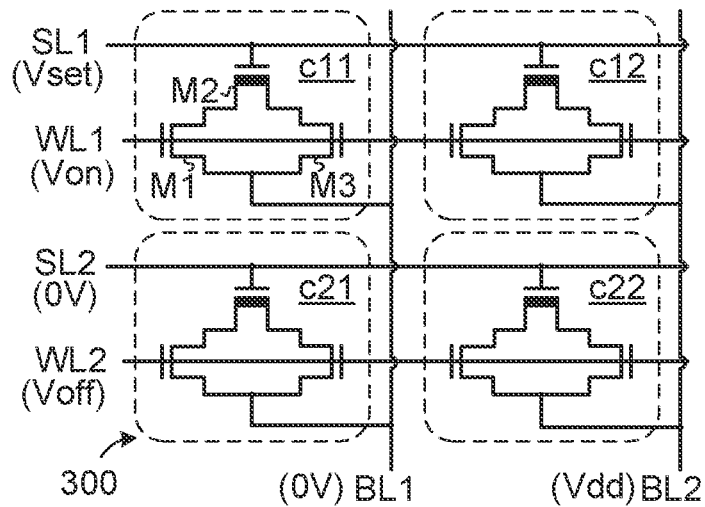
FIG. 4C schematically illustrates the bias voltages for performing a set action on the cell array structure as shown in FIG. 3B.

FIG. 4C schematically illustrates the bias voltages for performing a set action on the cell array structure as shown in FIG. 3B. During the set action, the first word line WL1 receives the on voltage (Von), the second word line WL2 receives the off voltage (Voff), the first source line SL1 receives a set voltage (Vset), the second source line SL2 receives the ground voltage (0V), the first bit line BL1 receives the ground voltage (0V), and the second bit line BL2 receives the control voltage (Vdd). Consequently, the resistive random-access memory cell c11 is a selected memory cell, and the resistive random-access memory cells c12 and c22 are unselected memory cells. For example, the set voltage (Vset) is 2.15V, the on voltage (Von) is 0.8V, the control voltage (Vdd) is 0.8V, and the off voltage (Voff) is the ground voltage (0V).

In the selected memory cell c11, the first transistor M1 and the third transistor M3 are turned on. Consequently, the insulation layer in the gate structure of the second transistor M2 is subjected to the set voltage. Under this circumstance, the second transistor M2 is in the set state corresponding to the low resistance value. That is, the selected memory cell is in the set state corresponding to the low resistance value. The method of performing the set action on each of the other resistive random-access memory cells c12~c22 is similar to the method of performing the set action on the resistive random-access memory cell c11 through the provision of proper bias voltages.

Figure 4D:
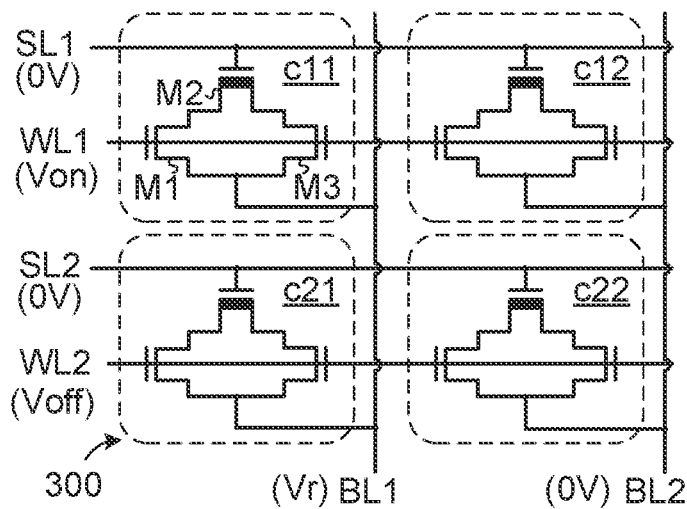
FIG. 4D schematically illustrates the bias voltages for performing a read action on the cell array structure as shown in FIG. 3B.

FIG. 4D schematically illustrates the bias voltages for performing a read action on the cell array structure as shown in FIG. 3B. During the read action, the first word line WL1 receives the on voltage (Von), the second word line WL2 receives the off voltage (Voff), the first source line SL1 receive the ground voltage (0V), the second source line SL2 receive the ground voltage (0V), the first bit line BL1 receives a read voltage (Vr), and the second bit line BL2 receives the ground voltage (0V). Consequently, the resistive random-access memory cell c11 is a selected memory cell, and the resistive random-access memory cells c12 and c22 are unselected memory cells. For example, the read voltage (Vr) is 0.7V~1.2V, the on voltage (Von) is 0.8V, and the off voltage (Voff) is the ground voltage (0V). That is, the forming voltage (Vpp) is higher than the set voltage (Vset), the set voltage (Vset) is higher than the reset voltage (Vreset), and the reset voltage (Vreset) is higher than the read voltage (Vr).

In the selected memory cell c11, the first transistor M1 and the third transistor M3 are turned on. Consequently, the insulation layer in the gate structure of the second transistor M2 is subjected to the read voltage. Under this circumstance, a read current is generated between the first bit line BL1 and the first source line SL1.

When the second transistor M2 is in the set state with corresponding to the low resistance value, the magnitude of the read current generated by the selected memory cell c11 is higher. When the second transistor M2 is in the reset state with corresponding to the high resistance value, the magnitude of the read current generated by the selected memory cell c11 is lower. Consequently, the selected memory cell c11 is determined as the set state or the reset state according to the read current generated by the selected memory cell c11. The method of performing the read action on each of the other resistive random-access memory cells c12~c22 is similar to the method of performing the read action on the resistive random-access memory cell c11 through the provision of proper bias voltages.

Figure 5A:
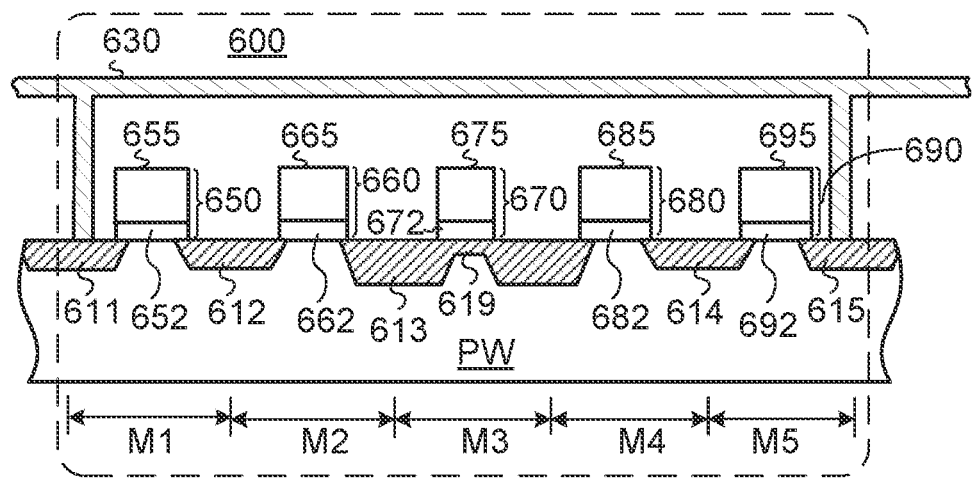
FIG. 5A is a schematic cross-sectional view illustrating a resistive random-access memory cell according to a second embodiment of the present invention.
Figure 5B:
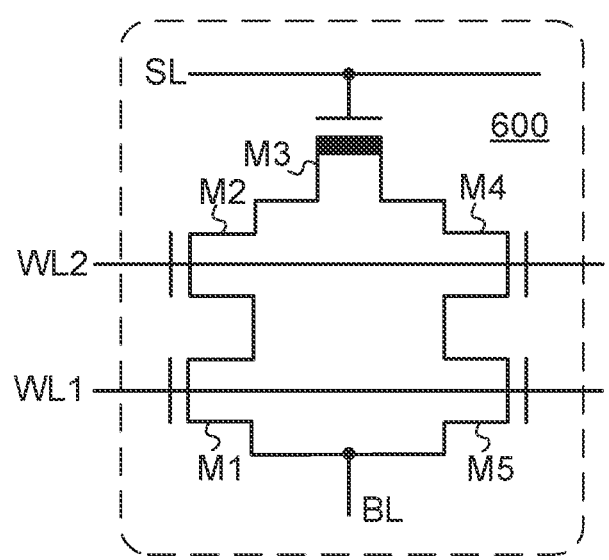
FIG. 5B is a schematic equivalent circuit diagram of the resistive random-access memory cell according to the second embodiment of the present invention.

FIG. 5A is a schematic cross-sectional view illustrating a resistive random-access memory cell according to a second embodiment of the present invention. FIG. 5B is a schematic equivalent circuit diagram of the resistive random-access memory cell according to the second embodiment of the present invention.

As shown in FIG. 5A, five doped regions 611, 612, 613, 614 and 615 are formed under the surface of a P-well region PW, and five gate structures 650, 660, 670, 680 and 690 are formed over the surface of a P-well region PW. The first gate structure 650 is arranged between the first doped region 611 and the second doped region 612. The second gate structure 660 is arranged between the second doped region 612 and the third doped region 613. The third gate structure 670 is located over the third doped region 613. The fourth gate structure 680 is located between the third doped region 613 and the fourth doped region 614. The fifth gate structure 690 is arranged between the fourth doped region 614 and the fifth doped region 615. Moreover, an extended lightly doped drain (LDD) region 619 is formed in the third doped region 613. In other words, the third doped region 613 is a merged doped region. It is to be noted that in another embodiment, the extended lightly doped drain (LDD) region can be omitted.

The gate structures 650, 660, 670, 680 and 690 have the same structure. The gate structure 650 comprises an insulation layer 652 and a conductive layer 655. The gate structure 660 comprises an insulation layer 662 and a conductive layer 665. The gate structure 670 comprises an insulation layer 672 and a conductive layer 675. The gate structure 680 comprises an insulation layer 682 and a conductive layer 685. The gate structure 690 comprises an insulation layer 692 and a conductive layer 695. Take the third gate structure 670 for example. The insulation layer 672 is located over the third doped region 613. The conductive layer 675 is located above the insulation layer 672.

In this embodiment, each of the insulation layer 672 and the conductive layer 675 is a stack structure with plural material layers. For example, the insulation layer 672 is a stack structure with a silicon dioxide layer ($SiO_2$) and a hafnium dioxide layer ($HfO_2$), and the conductive layer 675 is a stack structure with a titanium layer (Ti), a titanium nitride layer (TiN) and a tungsten layer (W). The hafnium dioxide layer ($HfO_2$) is a high dielectric constant (high-k) material layer, which is suitable for an oxide-based resistive random-access memory. The silicon dioxide layer ($SiO_2$) is located over the surface of the P-well region PW. The hafnium dioxide layer ($HfO_2$) is located over the silicon dioxide layer ($SiO_2$). The titanium layer (Ti) is located over the hafnium dioxide layer ($HfO_2$). The titanium layer (TiN) is located over the titanium layer (Ti). The tungsten layer (W) is located over the titanium nitride layer (TiN).

It is noted that the examples of the material layers of the gate structure are not restricted. That is, the material layers may be modified. For example, in another embodiment, the high high-k material layer in the insulation layer 672 is replaced by a tantalum oxide layer ($Ta_2O_5$). Alternatively, the conductive layer 675 is a stack structure with a titanium layer (Ti) and a tungsten layer (W).

Please refer to FIG. 5A again. A first metal layer 630 is formed over the five gate structures 650, 660, 670, 680 and 690, and connected with the first doped region 611 and the fifth doped region 615 through two vias (not shown). The first metal layer 630 is served as a bit line BL of the resistive random-access memory cell 600. A second metal layer (not shown) is connected with the conductive layers 655 and 695. The second metal layer is served as a first word line WL1 of the resistive random-access memory cell 600. A third metal layer (not shown) is connected with the conductive layers 665 and 685. The third metal layer is served as a second word line WL2 of the resistive random-access memory cell 600. The conductive layer 675 is served as a source line SL of the resistive random-access memory cell 600.

Please refer to FIG. 5A again. The first doped region 611, the second doped region 612 and the first gate structure 650 are collaboratively formed as a first transistor M1. The second doped region 612, the third doped region 613 and the second gate structure 660 are collaboratively formed as a second transistor M2. The third doped region 613 and the third gate structure 670 are collaboratively formed as a third transistor M3. The third doped region 613, the fourth doped region 614 and the fourth gate structure 680 are collaboratively formed as a fourth transistor M4. The fourth doped region 614, the fifth doped region 615 and the fifth gate structure 690 are collaboratively formed as a fifth transistor M5. As mentioned above, the third doped region 613 is the merged doped region. Consequently, it is considered that the two drain/source terminals of the third transistor M3 are connected with each other.

As shown in FIG. 5B, the resistive random-access memory cell 600 comprises five transistors M1, M2, M3, M4 and M5. The first drain/source terminal of the first transistor M1 is connected with the bit line BL. The gate terminal of the first transistor M1 is connected with the first word line WL1. The first drain/source terminal of the fifth transistor M5 is connected with the bit line BL. The gate terminal of the fifth transistor M5 is connected with the first word line WL1. The first drain/source terminal of the second transistor M2 is connected with the second drain/source terminal of the first transistor M1. The gate of the second transistor M2 is connected with the second word line WL2. The first drain/source terminal of the fourth transistor M4 is connected with the second drain/source terminal of the fifth transistor M5. The gate terminal of the fourth transistor M4 is connected with the second word line WL2. The first drain/source terminal and the second drain/source terminal of the third transistor M3 are connected with each other. The first drain/source terminal of the third transistor M3 is connected with the second drain/source terminal of the second transistor M2. The gate terminal of the third transistor M3 is connected with the source line SL. The second drain/source terminal of the third transistor M3 is connected with the second drain/source terminal of the fourth transistor M4. In other words, the resistive random-access memory cell 600 of this embodiment has a five-transistor configuration, which is also referred as a 5T cell configuration.

Figure 6:
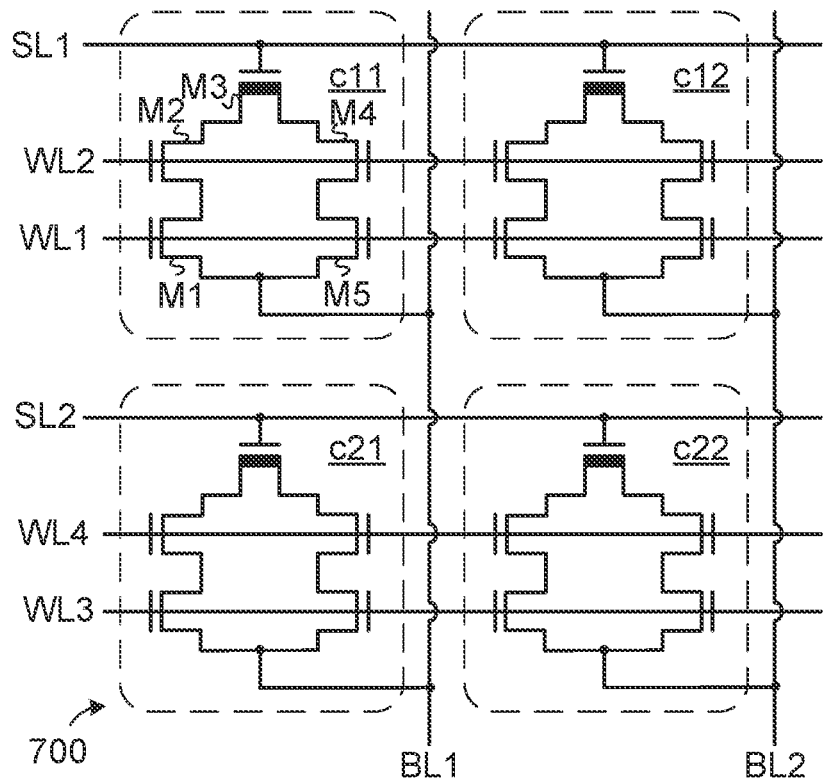
FIG. 6 is a schematic equivalent circuit diagram illustrating a cell array structure according to another embodiment of the present invention.

Moreover, plural random-access memory cells can be combined as a cell array structure. FIG. 6 is a schematic equivalent circuit diagram illustrating the cell array structure according to another embodiment of the present invention. The cell array structure comprises m×n random-access memory cells, wherein m and n are positive integers. For illustration, the cell array structure 700 of this embodiment comprises 2×2 random-access memory cells c11~c22. Each of the resistive random-access memory cells c11~c22 has the structure as shown in FIGS. 5A and 5B.

Please refer to the cell array structure 700 of FIG. 6. Both of the two random-access memory cells c11~c12 in the first row are connected with the first word line WL1, the second word line WL2 and the first source line SL1. Moreover, the resistive random-access memory cells c11~c12 are connected with the first bit line BL1 and the second bit line BL2, respectively. Both of the two random-access memory cells c21~c22 in the second row are connected with the third word line WL3, the fourth word line WL4 and the second source line SL2. Moreover, the resistive random-access memory cells c21~c22 are connected with the first bit line BL1 and the second bit line BL2, respectively.

By providing proper bias voltages to the word lines WL1~WL4, the source lines SL1~SL2 and the bit lines BL1~BL2 of the cell array structure 700, a forming action, a reset action, a set action or a read action can be selectively performed.

The bias voltages for performing different actions on the cell array structure 700 are shown in FIGS. 7A-7D. Whenever the cell array structure 700 is enabled, two word lines are activated. The row of the cell array structure 700 corresponding to the activated word lines is referred as a selected row. The rows of the cell array structure 700 corresponding to the other word lines are unselected rows.

Figure 7A:
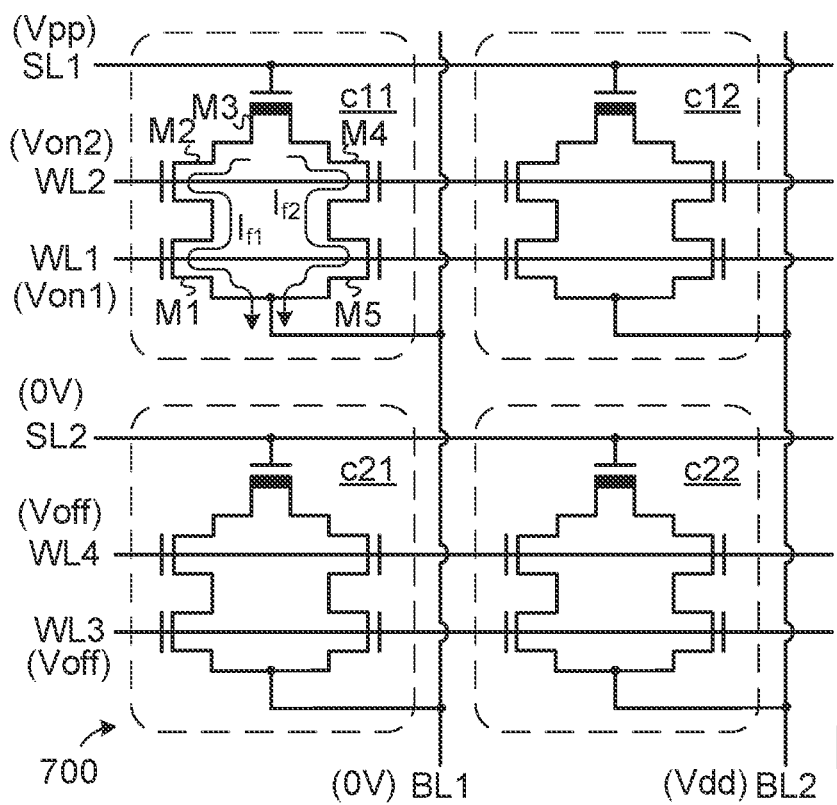
FIG. 7A schematically illustrates the bias voltages for performing a forming action on the cell array structure as shown in FIG. 6.

After the cell array structure 700 is manufactured, the resistive random-access memory cells c21 to c22 are all in an initial state. Consequently, it is necessary to perform a forming action. The bias voltages for performing a forming action on the cell array structure 700 is shown in FIG. 7A.

During the forming operation, the first word line WL1 receives a first on voltage (Von1), the second word line WL2 receives a second on voltage (Von2), the third word line WL3 and the fourth word line WL4 receive an off voltage (Voff), the first source line SL1 receives a forming voltage (Vpp), the second source line SL2 receives a ground voltage (0V), the first bit line BL1 receives the ground voltage (0V), and the second bit line BL2 receives a control voltage (Vdd). Consequently, in the cell array structure 700, the first row connected to the first word line WL1 and the second word line WL2 is a selected row, and the second row connected to the third word line WL3 and the fourth word line WL4 is an unselected row. The forming voltage (Vpp), the first on voltage (Von1), the second on voltage (Von2) and the control voltage (Vdd) are all positive voltages. The forming voltage (Vpp) is higher than the second on voltage (Von2). The second on voltage (Von2) is higher than the first on voltage (Von1). The formation voltage (Vpp) is higher than the control voltage (Vdd). For example, the forming voltage (Vpp) is 4V, the second on voltage (Von2) is 2V, the first on voltage (Von1) is 0.8V, the control voltage (Vdd) is 0.8V, and the off voltage (Voff) is the ground voltage (0V).

In the selected row, the first source line SL1 receives the forming voltage (Vpp), and the first bit line BL1 receives the ground voltage (0V). Consequently, the resistive random-access memory cell c11 is a selected memory cell. Since the second bit line BL2 receives the control voltage (Vdd), the resistive random-access memory cell c12 is an unselected memory cell. In the unselected row, the third word line WL3 and the fourth word line WL4 receives the off voltage (Voff). Consequently, the resistive random-access memory cells c21 and c22 are unselected memory cells.

In the selected memory cell c11, the first transistor M1, the second transistor M2, the fourth transistor M4, and the fifth transistor M5 are turned on. Consequently, the insulation layer in the gate structure of the third transistor M3 is subjected to the forming voltage, and a forming current is generated between the first source line SL1 and the first bit line BL1. The first portion $I_{f1}$ of the forming current flows to the first bit line BL1 through the second transistor M2 and the first transistor M1, and the second portion Ire of the forming current flows to the first bit line BL1 through the fourth transistor M4 and the fifth transistor M5. Due to the forming current, a conducting filament is formed in the insulation layer. The method of performing the forming action on each of the other resistive random-access memory cells c12~c22 is similar to the method of performing the forming action on the resistive random-access memory cell c11 through the provision of proper bias voltages.

Generally, if the forming current is too large during the forming action, the insulation layer in the selected memory cell c11 is possibly ruptured. For solving these drawbacks, a current limiter is connected with either the first source line SL1 or the first bit line BL1 of the selected memory cell c11 to limit the magnitude of the forming current and prevent from the rupture of the insulation layer in the selected memory cell c11.

Figure 7B:
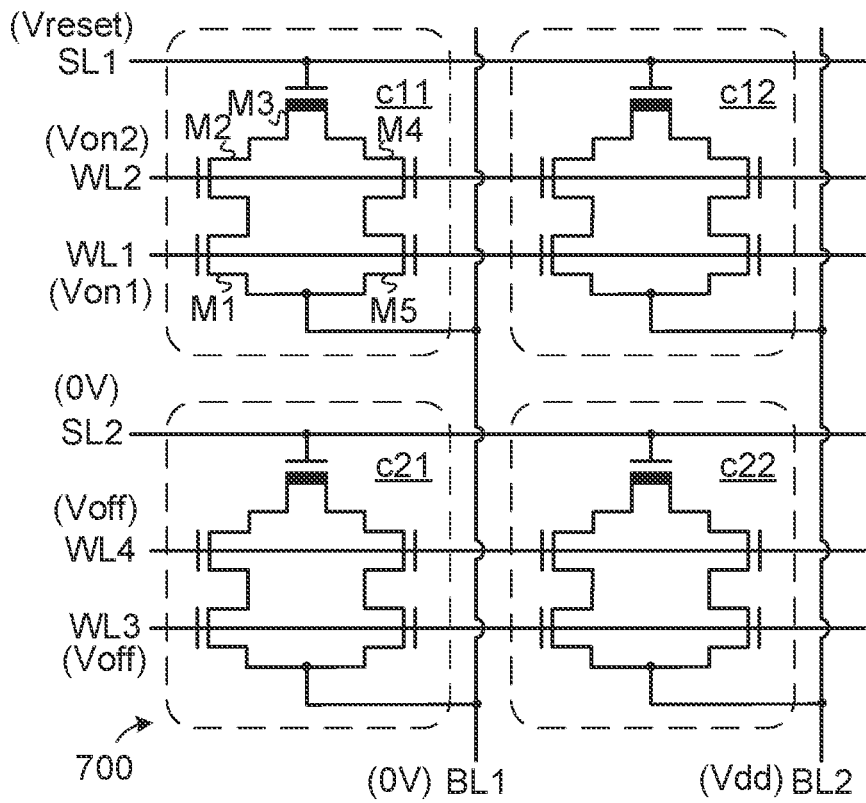
FIG. 7B schematically illustrates the bias voltages for performing a reset action on the cell array structure as shown in FIG. 6.

FIG. 7B schematically illustrates the bias voltages for performing a reset action on the cell array structure as shown in FIG. 6. During the reset action, the first word line WL1 receives the first on voltage (Von1), the second word line WL2 receives the second on voltage (Von2), the third word line WL3 and the fourth word line WL4 receive the off voltage (Voff), the first source line SL1 receives a reset voltage (Vreset), the second source line SL2 receives the ground voltage (0V), the first bit line BL1 receives the ground voltage (0V), and the second bit line BL2 receives the control voltage (Vdd). Consequently, the resistive random-access memory cell c11 is a selected memory cell, and the resistive random-access memory cells c12 and c22 are unselected memory cells. For example, the reset voltage (Vreset) is 1.65V, the second on voltage (Von2) is 2V, the first on voltage (Von) is 0.8V, the control voltage (Vdd) is 0.8V, and the off voltage (Voff) is the ground voltage (0V).

In the selected memory cell c11, the first transistor M1, the second transistor M2, the fourth transistor M4, and the fifth transistor M5 are turned on. Consequently, the insulation layer in the gate structure of the third transistor M3 is subjected to the reset voltage. Under this circumstance, the third transistor M3 is in a reset state corresponding to a high resistance value. That is, the selected memory cell is in the reset state corresponding to the high resistance value. The method of performing the reset action on each of the other resistive random-access memory cells c12~c22 is similar to the method of performing the reset action on the resistive random-access memory cell c11 through the provision of proper bias voltages.

Figure 7C:
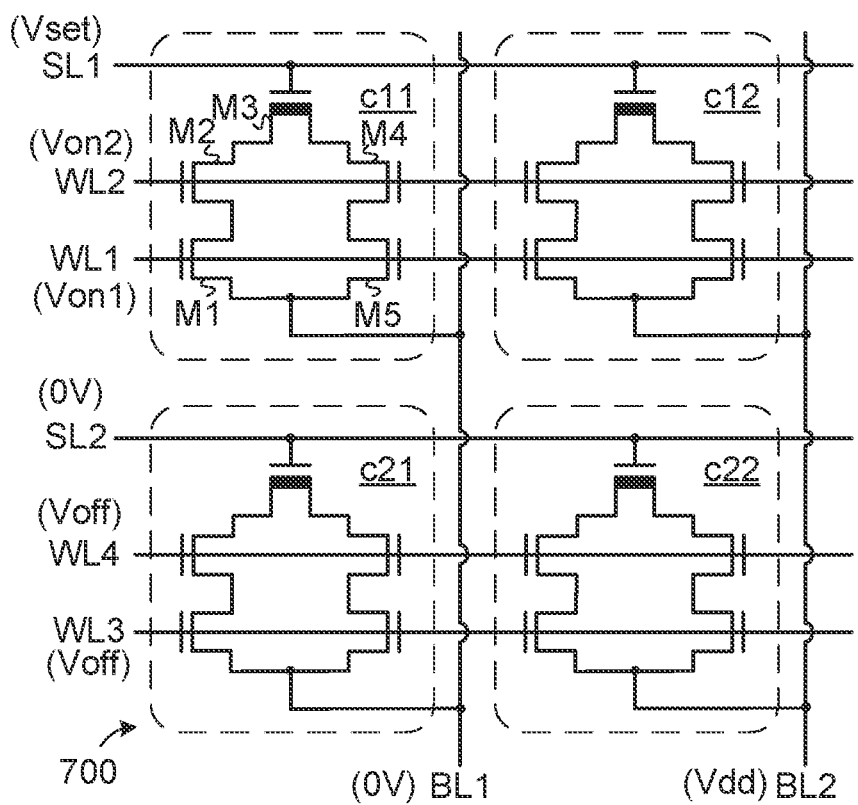
FIG. 7C schematically illustrates the bias voltages for performing a set action on the cell array structure as shown in FIG. 6.

FIG. 7C schematically illustrates the bias voltages for performing a set action on the cell array structure as shown in FIG. 6. During the set action, the first word line WL1 receives the first on voltage (Von1), the second word line WL2 receives the second on voltage (Von2), the third word line WL3 and the fourth word line WL4 receives the off voltage (Voff), the first source line SL1 receives a set voltage (Vset), the second source line SL2 receives the ground voltage (0V), the first bit line BL1 receives the ground voltage (0V), and the second bit line BL2 receives the control voltage (Vdd). Consequently, the resistive random-access memory cell c11 is a selected memory cell, and the resistive random-access memory cells c12 and c22 are unselected memory cells. For example, the set voltage (Vset) is 2.15V, the second on voltage (Von2) is 2V, the first on voltage (Von1) is 0.8V, the control voltage (Vdd) are 0.8V, and the off voltage (Voff) is the ground voltage (0V).

In the selected memory cell c11, the first transistor M1, the second transistor M2, the fourth transistor M4, and the fifth transistor M5 are turned on. Consequently, the insulation layer in the gate structure of the third transistor M3 is subjected to the set voltage. Under this circumstance, the third transistor M3 is in the set state corresponding to the low resistance value. That is, the selected memory cell is in the set state corresponding to the low resistance value. The method of performing the set action on each of the other resistive random-access memory cells c12~c22 is similar to the method of performing the set action on the resistive random-access memory cell c11 through the provision of proper bias voltages.

Figure 7D:
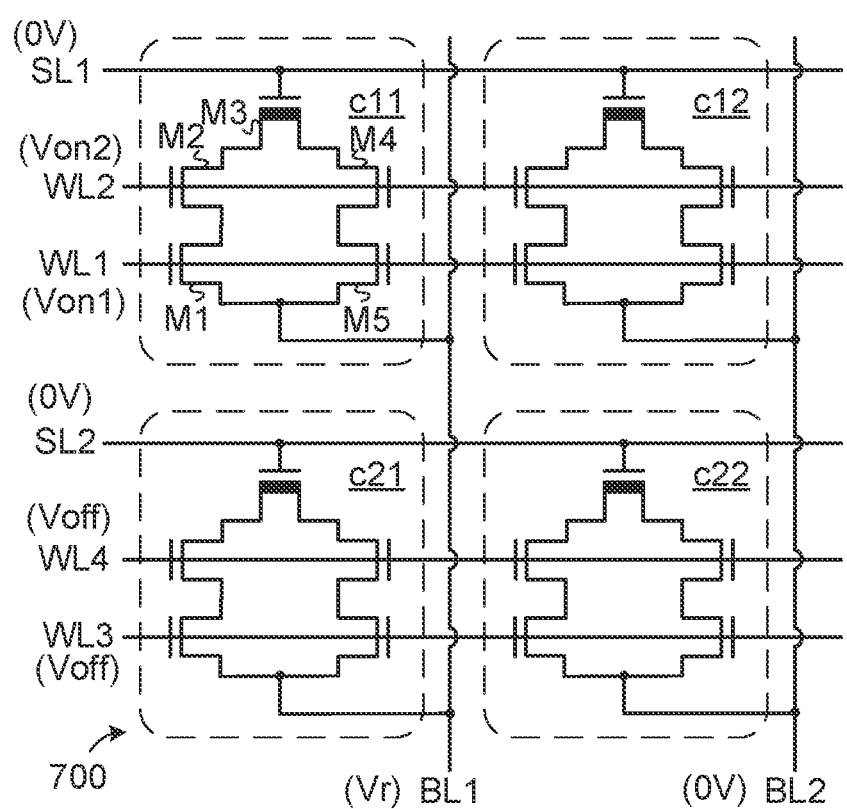
FIG. 7D schematically illustrates the bias voltages for performing a read action on the cell array structure as shown in FIG. 6.

FIG. 7D schematically illustrates the bias voltages for performing a read action on the cell array structure as shown in FIG. 6. During the read action, the first word line WL1 receives the first on voltage (Von1), the second word line WL2 receives the second on voltage (Von2), the third word line WL3 and the fourth word line WL4 receive the off voltage (Voff), the first source line SL1 receive the ground voltage (0V), the second source line SL2 receive the ground voltage (0V), the first bit line BL1 receives a read voltage (Vr), and the second bit line BL2 receives the ground voltage (0V). Consequently, the resistive random-access memory cell c11 is a selected memory cell, and the resistive random-access memory cells c12 and c22 are unselected memory cells. For example, the read voltage (Vr) is 0.7V~1.2V, the first on voltage (Von1) is 0.8V, and the second on voltage (Von2) is 0.8V. That is, the forming voltage (Vpp) is higher than the set voltage (Vset), the set voltage (Vset) is higher than the reset voltage (Vreset), and the reset voltage (Vreset) is higher than the read voltage (Vr).

In the selected memory cell c11, the first transistor M1, the second transistor M2, the fourth transistor M4, and the fifth transistor M5 are turned on. Consequently, the insulation layer in the gate structure of the third transistor M3 is subjected to the read voltage. Under this circumstance, a read current is generated between the first bit line BL1 and the first source line SL1.

When the third transistor M3 is in the set state with corresponding to the low resistance value, the magnitude of the read current generated by the selected memory cell c11 is higher. When the third transistor M3 is in the reset state with corresponding to the high resistance value, the magnitude of the read current generated by the selected memory cell c11 is lower. Consequently, the selected memory cell c11 is determined as the set state or the reset state according to the read current generated by the selected memory cell c11. The method of performing the read action on each of the other resistive random-access memory cells c12~c22 is similar to the method of performing the read action on the resistive random-access memory cell c11 through the provision of proper bias voltages.

From the above descriptions, the present invention provides a resistive random-access memory cell and an associated cell array structure. The resistive random-access memory cell has a three-transistor configuration (i.e., a 3T cell configuration) or a five-transistor configuration (i.e., a 5T cell configuration). By providing proper bias voltages, a forming action, a reset action, a set action or a read action can be selectively performed on the resistive random-access memory cell.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A cell array structure comprising a first resistive random-access memory cell, the first resistive random-access memory cell comprising:
   a well region;
   a first doped region, a second doped region and a third doped region formed under a surface of the well region;
   a first gate structure formed over the surface of the well region between the first doped region and the second doped region, wherein the first gate structure comprises a stack structure with a first insulation layer and a first conductive layer;
   a second gate structure formed over the second doped region, wherein the second gate structure comprises a stack structure with a second insulation layer and a second conductive layer, and the second conductive layer is served as a first source line;
   a third gate structure formed over the surface of the well region between the second doped region and the third doped region, wherein the third gate structure comprises a stack structure with a third insulation layer and a third conductive layer;
   a first metal layer connected with the first doped region and the third doped region, wherein the first metal layer is served as a first bit line; and
   a second metal layer connected with the first conductive layer and the third conductive layer, wherein the second metal layer is served as a first word line,
   wherein during a forming action, the first source line receives a forming voltage, the first word line receives an on voltage, the first bit line receives a ground voltage, and a conducting filament is formed in the second insulation layer;
   wherein during the forming action, the first source line or the first bit line is connected to a current limiter, so that a forming current generated by the first resistive random-access memory cell is limited.

2. A cell array structure comprising a first resistive random-access memory cell, the first resistive random-access memory cell comprising:
   a well region;
   a first doped region, a second doped region and a third doped region formed under a surface of the well region;
   a first gate structure formed over the surface of the well region between the first doped region and the second doped region, wherein the first gate structure comprises a stack structure with a first insulation layer and a first conductive layer;
   a second gate structure formed over the second doped region, wherein the second gate structure comprises a stack structure with a second insulation layer and a second conductive layer, the second insulation layer comprises a high dielectric constant material layer, and the second conductive layer is served as a first source line;
   a third gate structure formed over the surface of the well region between the second doped region and the third doped region, wherein the third gate structure comprises a stack structure with a third insulation layer and a third conductive layer;
   a first metal layer connected with the first doped region and the third doped region, wherein the first metal layer is served as a first bit line; and
   a second metal layer connected with the first conductive layer and the third conductive layer, wherein the second metal layer is served as a first word line,
   wherein during a forming action, the first source line receives a forming voltage, the first word line receives an on voltage, the first bit line receives a ground voltage, and a conducting filament is formed in the second insulation layer.

3. The cell array structure as claimed in claim 2, wherein the high dielectric constant material layer is a hafnium dioxide layer, or a tantalum oxide layer.

4. The cell array structure as claimed in claim 2, wherein during a reset action, the first source line receives a reset voltage, the first word line receives the on voltage, and the first bit line receives the ground voltage, so that the first resistive random-access memory cell is in a reset state corresponding to a high resistance value.

5. The cell array structure as claimed in claim 2, wherein during a set action, the first source line receives a set voltage, the first word line receives the on voltage, and the first bit line receives the ground voltage, so that the first resistive random-access memory cell is in the set state corresponding to a low resistance value.

6. The cell array structure as claimed in claim 2, wherein during a read action, the first source line receives the ground voltage, the first word line receives the on voltage, and the first bit line receives a read voltage, so that the first resistive random-access memory cell generates a read current, wherein a state of the first resistive random-access memory cell is determined according to the read current.

7. The cell array structure as claimed in claim 2, wherein the first doped region, the second doped region and the first gate structure are collaboratively formed as a first transistor, the second doped region and the second gate structure are collaboratively formed as a second transistor, and the second doped region, the third doped region and the third gate structure are collaboratively formed as a third transistor, wherein a first drain/source terminal of the first transistor is connected with the first bit line, a gate terminal of the first transistor is connected with the first word line, a first drain/source terminal of the third transistor is connected with the first bit line, a gate terminal of the third transistor is connected with the first word line, a first drain/source terminal of the second transistor is connected with a second drain/source terminal of the first transistor, a second drain/source terminal of the second transistor is connected with a second drain/source terminal of the third transistor, a gate terminal of the second transistor is connected with the first source line, and the first drain/source terminal of the second transistor and the second drain/source terminal of the second transistor are connected with each other.

8. The cell array structure as claimed in claim 7, wherein the cell array structure further comprises a second resistive random-access memory cell, and the second resistive random-access memory cell comprises a fourth transistor, a fifth transistor and a sixth transistor, wherein a first drain/source terminal of the fourth transistor is connected with a second bit line, a gate terminal of the fourth transistor is connected with the first word line, a first drain/source terminal of the sixth transistor is connected with the second bit line, a gate terminal of the sixth transistor is connected with the first word line, a first drain/source terminal of the fifth transistor is connected with a second drain/source terminal of the fourth transistor, a second drain/source terminal of the fifth transistor is connected with a second drain/source terminal of the sixth transistor, a gate terminal of the fifth transistor is connected with the first source line, and the first drain/source terminal of the fifth transistor and the second drain/source terminal of the fifth transistor are connected with each other.

9. The cell array structure as claimed in claim 8, wherein the cell array structure further comprises a third resistive random-access memory cell, and the third resistive random-access memory cell comprises a seventh transistor, an eighth transistor and a ninth transistor, wherein a first drain/source terminal of the seventh transistor is connected with the first bit line, a gate terminal of the seventh transistor is connected with a second word line, a first drain/source terminal of the ninth transistor is connected with the first bit line, a gate terminal of the ninth transistor is connected with the second word line, a first drain/source terminal of the eighth transistor is connected with a second drain/source terminal of the seventh transistor, a second drain/source terminal of the eighth transistor is connected with a second drain/source terminal of the ninth transistor, a gate terminal of the eighth transistor is connected with a second source line, and the first drain/source terminal of the eighth transistor and the second drain/source terminal of the eighth transistor are connected with each other.

10. A cell array structure comprising a first resistive random-access memory cell, the first resistive random-access memory cell comprising:
 a well region;
 a first doped region, a second doped region, a third doped region, a fourth doped region and a fifth doped region formed under a surface of the well region;
 a first gate structure formed over the surface of the well region between the first doped region and the second doped region, wherein the first gate structure comprises a stack structure with a first insulation layer and a first conductive layer;
 a second gate structure formed over the surface of the well region between the second doped region and the third doped region, wherein the second gate structure comprises a stack structure with a second insulation layer and a second conductive layer;
 a third gate structure formed over the third doped region, wherein the third gate structure comprises a stack structure with a third insulation layer and a third conductive layer;
 a fourth gate structure formed over the surface of the well region between the third doped region and the fourth doped region, wherein the fourth gate structure comprises a stack structure with a fourth insulation layer and a fourth conductive layer;
 a fifth gate structure formed over the surface of the well region between the fourth doped region and the fifth doped region, wherein the fifth gate structure comprises a stack structure with a fifth insulation layer and a fifth conductive layer;
 a first metal layer connected with the first doped region and the fifth doped region, wherein the first metal layer is served as a first bit line;
 a second metal layer connected with the first conductive layer and the fifth conductive layer, wherein the second metal layer is served as a first word line; and
 a third metal layer connected with the second conductive layer and the fourth conductive layer, wherein the third metal layer is served as a second word line,
 wherein during a forming action, the first source line receives a forming voltage, the first word line receives a first on voltage, the second word line receives a second on voltage, the first bit line receives a ground voltage, and a conducting filament is formed in the third insulation layer.

11. The cell array structure as claimed in claim 10, wherein the second insulation layer comprises a high dielectric constant material layer.

12. The cell array structure as claimed in claim 11, wherein the high dielectric constant material layer is a hafnium dioxide layer, or a tantalum oxide layer.

13. The cell array structure as claimed in claim 10, wherein during the forming action, the first source line or the first bit line is connected to a current limiter, so that a forming current generated by the first resistive random-access memory cell is limited.

14. The cell array structure as claimed in claim 10, wherein during a reset action, the first source line receives a reset voltage, the first word line receives the first on voltage, the second word line receives the second on voltage, and the first bit line receives the ground voltage, so that the first resistive random-access memory cell is in a reset state corresponding to a high resistance value.

15. The cell array structure as claimed in claim 10, wherein during a set action, the first source line receives a set voltage, the first word line receives the first on voltage, the second word line receives the second on voltage, and the first bit line receives the ground voltage, so that the first resistive random-access memory cell is in the set state corresponding to the low resistance value.

16. The cell array structure as claimed in claim 10, wherein during a read action, the first source line receives the ground voltage, the first word line receives the first on voltage, the second word line receives the second on voltage, and the first bit line receives a read voltage, so that the first resistive random-access memory cell generates a read current, wherein a state of the first resistive random-access memory cell is determined according to the read current.

17. The cell array structure as claimed in claim 10, wherein the first doped region, the second doped region and the first gate structure are collaboratively formed as a first transistor, the second doped region, the third doped region and the second gate structure are collaboratively formed as a second transistor, the third doped region and the third gate structure are collaboratively formed as a third transistor, the third doped region, the fourth doped region and the fourth gate structure are collaboratively formed as a fourth transistor, and the fourth doped region, the fifth doped region and the fifth gate structure are collaboratively formed as a fifth transistor, wherein a first drain/source terminal of the first transistor is connected with the first bit line, a gate terminal of the first transistor is connected with the first word line, a first drain/source terminal of the fifth transistor is connected with the first bit line, a gate terminal of the fifth transistor s connected with the first word line, a first drain/source terminal of the second transistor is connected with a second drain/source terminal of the first transistor, a gate of the second transistor is connected with the second word line, a first drain/source terminal of the fourth transistor is connected with a second drain/source terminal of the fifth transistor, a gate terminal of the fourth transistor is connected with the second word line, a first drain/source terminal of the third transistor is connected with a second drain/source terminal of the second transistor, a second drain/source terminal of the third transistor is connected with a second drain/source terminal of the fourth transistor, a gate terminal of the third transistor is connected with the first source line, and the first drain/source terminal of the third transistor and the second drain/source terminal of the third transistor are connected with each other.

18. The cell array structure as claimed in claim 17, wherein the cell array structure further comprises a second resistive random-access memory cell, and the second resistive random-access memory cell comprises a sixth transistor, a seventh transistor, an eighth transistor, a ninth transistor and a tenth transistor, wherein a first drain/source terminal of the sixth transistor is connected with a second bit line, a gate terminal of the sixth transistor is connected with the first word line, a first drain/drain terminal of the tenth transistor is connected with the second bit line, a gate terminal of the tenth transistor is connected with the first word line, a first drain/source terminal of the seventh transistor is connected with a second drain/source terminal of the sixth transistor, a gate terminal of the seventh transistor is connected with the second word line, a first drain/source terminal of the ninth transistor is connected with a second drain/source terminal of the tenth transistor, a gate terminal of the ninth transistor is connected with the second word line, a first drain/source terminal of the eighth transistor is connected with a second drain/source terminal of the seventh transistor, a second drain/source terminal of the eighth transistor is connected with a second drain/drain terminal of the ninth transistor, a gate terminal of the eighth transistor is connected with the first source line, and the first drain/source terminal of the eighth transistor and the second drain/source terminal of the eighth transistor are connected with each other.

19. The cell array structure as claimed in claim 18, wherein the cell array structure further comprises a third resistive random-access memory cell, and the third resistive random-access memory cell comprises an eleventh transistor, a twelfth transistor, a thirteenth transistor, a fourteenth transistor and a fifteenth transistor, wherein a first drain/source terminal of the eleventh transistor is connected with the first bit line, a gate terminal of the eleventh transistor is connected with a third word line, a first drain/source terminal of the fifteenth transistor is connected with the first bit line, a gate terminal of the fifteenth transistor is connected with the third word line, a first drain/source terminal of the twelfth transistor is connected with the eleventh transistor, a gate terminal of the twelfth transistor is connected with a fourth bit line, a first drain/source terminal of the fourteenth transistor is connected with a second drain/source terminal of the fifteenth transistor, a gate terminal of the fourteenth transistor is connected with the fourth character line, a first drain/source terminal of the thirteenth transistor is connected with a second drain/source terminal of the twelfth transistor, a second drain/source terminal of the thirteenth transistor is connected with a second drain/source terminal of the fourteenth transistor, a gate terminal of the thirteenth transistor is connected with a second source line, and the first drain/source terminal of the thirteenth transistor and the second drain/source terminal of the thirteenth transistor are connected with each other.

* * * * *